(12) United States Patent
Fujiwara et al.

(10) Patent No.: US 10,254,357 B2
(45) Date of Patent: Apr. 9, 2019

(54) NMR PROBE

(71) Applicants: Osaka University, Osaka (JP); JEOL Ltd., Tokyo (JP)

(72) Inventors: Toshimichi Fujiwara, Osaka (JP); Yoh Matsuki, Osaka (JP); Shinji Nakamura, Tokyo (JP)

(73) Assignees: Osaka University, Osaka (JP); JEOL Ltd., Tokyo (JP)

( * ) Notice: Subject to any disclaimer, the term of this patent is extended or adjusted under 35 U.S.C. 154(b) by 402 days.

(21) Appl. No.: 15/008,767

(22) Filed: Jan. 28, 2016

(65) Prior Publication Data
US 2016/0223628 A1   Aug. 4, 2016

(30) Foreign Application Priority Data

Jan. 29, 2015   (JP) ................................. 2015-016082

(51) Int. Cl.
| G01R 33/31 | (2006.01) |
| G01R 33/30 | (2006.01) |
| G01R 33/28 | (2006.01) |

(52) U.S. Cl.
CPC ........... *G01R 33/31* (2013.01); *G01R 33/282* (2013.01); *G01R 33/307* (2013.01)

(58) Field of Classification Search
CPC ..... G01R 33/307; G01R 33/31; G01R 33/282
See application file for complete search history.

(56) References Cited

U.S. PATENT DOCUMENTS

| 5,218,964 A * | 6/1993 | Sepponen ............... A61B 5/055 324/309 |
| 2004/0233423 A1* | 11/2004 | Nakayama ......... G01N 21/0303 356/246 |
| 2008/0242974 A1 | 10/2008 | Urbahn et al. |
| 2009/0121712 A1* | 5/2009 | Han ...................... G01R 33/282 324/307 |
| 2010/0301853 A1* | 12/2010 | Happer ................ G01R 33/282 324/304 |
| 2010/0321018 A1* | 12/2010 | Takegoshi ............ G01R 33/307 324/318 |

(Continued)

FOREIGN PATENT DOCUMENTS

| JP | 2004219361 A | 8/2004 |
| JP | 2008241493 A | 10/2008 |

(Continued)

*Primary Examiner* — G. M. A. Hyder
(74) *Attorney, Agent, or Firm* — The Webb Law Firm

(57) ABSTRACT

A sample rotor is placed in a sample chamber inside an inner container. An air bearing type rotation mechanism blows a refrigerant gas (composed of a bearing gas and a driving gas) onto the sample rotor, to rotate the sample rotor and simultaneously cool the same. The refrigerant gas discharged from the air bearing type rotation mechanism is filled in an internal space (such as the sample chamber and a detection circuit chamber) of the inner container. An upper airtight chamber is formed between an outer container and the inner container. A lower airtight chamber is formed below a sealing bulkhead within a bottom unit. The upper and lower airtight chambers are in vacuum states to thereby function as vacuum insulation spaces for the internal space of the inner container.

9 Claims, 14 Drawing Sheets

(56) References Cited

U.S. PATENT DOCUMENTS

| | | | | |
|---|---|---|---|---|
| 2011/0080171 A1* | 4/2011 | Takegoshi | ............ | G01R 33/307 |
| | | | | 324/318 |
| 2012/0007599 A1* | 1/2012 | Prestegard | ............... | G01N 1/42 |
| | | | | 324/309 |
| 2013/0009643 A1* | 1/2013 | Miki | .................... | G01R 33/307 |
| | | | | 324/320 |
| 2013/0088232 A1* | 4/2013 | Inukai | .................... | G01N 24/08 |
| | | | | 324/321 |
| 2014/0123681 A1 | 5/2014 | Urbahn et al. | | |
| 2014/0125340 A1* | 5/2014 | Hunkeler | ............. | G01R 33/307 |
| | | | | 324/321 |
| 2015/0048829 A1* | 2/2015 | De Paepe | ............ | G01R 33/307 |
| | | | | 324/321 |
| 2015/0075183 A1* | 3/2015 | Hirsch | ................. | G01R 33/282 |
| | | | | 62/3.1 |
| 2015/0111751 A1* | 4/2015 | Choi | .................. | G01R 33/3403 |
| | | | | 505/162 |
| 2015/0177341 A1* | 6/2015 | De Paepe | ............ | G01R 33/305 |
| | | | | 324/309 |

FOREIGN PATENT DOCUMENTS

| | | | |
|---|---|---|---|
| JP | 2010523204 A | 7/2010 | |
| JP | 2014149291 A | 8/2014 | |
| WO | 2008121458 A1 | 10/2008 | |
| WO | 2013117627 A1 | 8/2013 | |

* cited by examiner

NMR PROBE

PRIORITY INFORMATION

This application claims priority to Japanese Patent Application No. 2015-016082 filed on Jan. 29, 2015, which is incorporated herein by reference in its entirety.

TECHNICAL FIELD

The present invention relates to a nuclear magnetic resonance (NMR) probe, and in particular to an NMR probe used for dynamical nuclear polarization.

BACKGROUND

There have been known, as magnetic resonance measuring apparatuses, a nuclear magnetic resonance (NMR) measuring apparatus and an electron spin resonance (ESR) measuring apparatus. As an apparatus categorized as the NMR measuring apparatus, a magnetic resonance imaging (MRI) apparatus has also been known. The NMR measuring apparatus will be explained below.

Nuclear magnetic resonance is a phenomenon in which atomic nuclei placed in a static magnetic field interact with an electromagnetic wave having a frequency specific to the atomic nuclei. An apparatus that utilizes the phenomenon for measuring a test sample at an atomic level is referred to as an NMR measuring apparatus. The NMR measuring apparatus has been used for analyzing materials, including organic compounds (such as, for example, chemical agents and agricultural chemicals), polymeric materials (such as, for example, vinyl and polyethylene), biological materials (such as, for example, nucleic acid and protein). Using the NMR measuring apparatus, for example, the molecular structure of a sample can be identified.

In general, the NMR measuring apparatus includes a control computer, an RF signal transmitter, an NMR signal detector (probe), a static magnetic field generator (a superconductive magnet), an NMR signal receiver, and other components. In some cases, however, the NMR measuring apparatus may refer to a part of the NMR measuring apparatus including some of the above-listed components. For example, a part corresponding to a spectrometer including the control computer, the RF signal transmitter, and the NMR signal receiver may be referred to as the NMR measuring apparatus. In typical NMR measurement, a radio frequency signal (RF transmission signal) used for the NMR measurement is generated in the transmitter and supplied to a transmitting and receiving coil in a probe. This generates an electromagnetic wave that causes a resonance absorption phenomenon in nuclei to be observed within the sample. Then, an NMR signal (RF reception signal) induced in the transmitting and receiving coil is sent to the receiver, and a spectrum of the received signal is analyzed.

Dynamic nuclear polarization (DNP) is known as a method for amplifying the strength of the NMR signal. In the DNP method, a substance (radical) including an unpaired electron is added to the sample, and a mixture of the radical and the sample is irradiated with a microwave to excite electron spin resonance. Through this excitation, a high degree of polarization of a spin of the unpaired electron is transferred to polarization of a nuclear spin, which leads to an approximately thousand-fold increase in the strength of the NMR signal.

The strength of the NMR signal obtained with the DNP method greatly depends on magnetic relaxation of the radical added to the sample. When the length of radical relaxation time is shorter, a magnetized state of the radical is attenuated before the polarization of the nuclear spin is enhanced, resulting in a lesser extent of the increase in strength of the NMR signal. It has been known that as the temperature becomes lower, the radical relaxation time becomes longer. For example, at temperatures of liquid nitrogen or below, the radical relaxation time is increased to a length substantially equal to or greater than the length of time to transfer magnetization between the electron spin and the nuclear spin. It is therefore expected that the strength of the NMR signal can be dramatically increased at the temperature of liquid nitrogen or below.

In an NMR apparatus described in JP 2010-523204 A, a sample is cooled by immersing the sample in liquid helium. Helium gas vaporized from the liquid helium is recondensed to thereby regenerate liquid helium for reuse.

In an NMR probe disclosed in JP 2008-241493 A, helium gas vaporized from liquid helium is used to cool down a transmitting and receiving coil, a variable capacitor, and a preliminary amplifier. In addition, a bearing gas and a driving gas are supplied to a sample rotor in order to rotate a sample rotor.

On the other hand, helium gas is circulated for cooling a transmitting and receiving coil and a tuning and matching circuit in an NMR probe described in JP 2004-219361 A.

When such a DNP method is applied, it is desirable that the sample be effectively cooled while avoiding a temperature rise in the sample as far as possible, to thereby prolong the radical relaxation time. When the sample is a solid substance, the sample rotor is typically rotated in an inclined position at a predetermined angle of inclination (at a so-called "magic angle"). The apparatus described in JP 2010-523204 A includes no mechanism for rotating the sample rotor, and is therefore unsuitable for use in measurement of a sample which should be rotated. Meanwhile, in the NMR probes described in JP 2008-241493 A and JP 2004-219361 A having no mechanism for cooling a sample, it is almost impossible to improve detection sensitivity in the DNP method.

SUMMARY

An advantage of the present invention is that a sample can be cooled effectively in an NMR probe used for dynamic nuclear polarization.

The NMR prove according to an aspect of the present invention is an NMR probe for detecting a nuclear magnetic resonance (NMR) signal from a sample, and the NMR probe includes a sample container that retains the sample, a rotation mechanism that blows a refrigerant gas to rotate the sample container and also cool the sample container, an inner structure that defines a refrigerant gas space filled with the refrigerant gas which is discharged from the rotation mechanism, and an outer structure that defines a vacuum insulation space surrounding the refrigerant gas space.

In the above-described configuration, the refrigerant gas is blown onto the sample, to thereby rotate the sample container and simultaneously cool down the sample container. The refrigerant gas space is defined by the inner structure, while the vacuum insulation space is formed so as to enclose the refrigerant gas space. The vacuum insulation space functions to secure thermal insulation for the refrigerant gas space. In this way, a temperature rise in the refrigerant gas space can be minimized to the extent possible, to thereby enable effective cooling of the sample.

In the above-described configuration, for example, dynamic nuclear polarization is employed. The sample may be, for example, a solid sample. A substance having an unpaired electron (a radical) is added to the sample. For the refrigerant gas, helium gas is used, for example. In this way, the temperature of the sample can be lowered to temperatures of liquid nitrogen or below. As the temperature is lowered, the length of radical relaxation time is extended, so that a greater increase in strength of an NMR signal can be achieved.

Preferably, the refrigerant gas space may include a first partial space filled with the refrigerant gas which is discharged from the rotation mechanism, and a second partial space that communicates with the first partial space and houses an electric circuit for detecting the nuclear magnetic resonance signal, and the inner structure may has a blower section for blowing the refrigerant gas from the first partial space toward the electric circuit housed in the second partial space.

In the above-described configuration, the electric circuit is a detection circuit including, for example, a tuning circuit and a matching circuit. The refrigerant gas discharged from the rotation mechanism is ejected from the first partial space to the second partial space and blown onto the electric circuit placed in the second partial space. In this way, the electric circuit is cooled down. In the above-described configuration, the refrigerant gas used for rotating and cooling the sample container is further blown onto the electric circuit. In other words, the refrigerant gas to be discharged as an exhaust gas is diverted for use in the cooling of the electric circuit.

Preferably, the NMR probe according to another aspect of the present invention further includes a first partition member that separates the first partial space from the second partial space, and the blower section is a refrigerant gas passage defined in the first partition member. With this configuration, the refrigerant gas discharged from the rotation mechanism is retained in the first partial space by the partition member. A flow path of the refrigerant gas is narrowed by the refrigerant gas passage formed in the partition member. The refrigerant gas passes through the refrigerant gas passage and naturally flows into the second partial space.

Preferably, the NMR probe according to still another aspect of the present invention further includes a feed pipe for feeding the refrigerant gas from outside the NMR probe to the rotation mechanism, and an outlet pipe for discharging the refrigerant gas from the refrigerant gas space to outside the NMR probe, and the vacuum insulation space includes a first vacuum insulation space formed between the feed pipe and the refrigerant gas space and a second vacuum insulation space formed between the outlet pipe and the refrigerant gas space. The vacuum insulation space formed around the feed pipe can ensure that the refrigerant gas within the feed pipe is thermally insulated. The vacuum insulation space formed around the outlet pipe can ensure that the refrigerant gas within the outlet pipe is thermally insulated. In this way, the rise in temperature of the refrigerant gas can be minimized to the extent possible.

Preferably, a cooling apparatus for cooling the refrigerant gas discharged from the outlet pipe and returning the cooled refrigerant gas back to the feed pipe may be installed to form a closed loop through which the refrigerant gas is circulated. According to this configuration, the refrigerant gas is reused, which can contribute to reduced consumption of the refrigerant gas.

Also preferably, the NMR probe according to another aspect of the present invention further includes a bypass section that blocks a route connecting the cooling apparatus to both the feed pipe and the outlet pipe, and accordingly directs the refrigerant gas to circulate within the cooling apparatus.

Further preferably, the inner structure may include an inner container that surrounds the refrigerant gas space and has an opening on a base end side, a sealing member for sealing the opening, a first sheath member arranged to sheathe the feed pipe with a first vacuum insulation space defined in the first sheath member, and a second sheath member arranged to sheathe the outlet pipe with the second vacuum insulation space defined in the second sheath member.

Preferably, the feed pipe may be extended from outside the NMR probe to the rotation mechanism, the outlet pipe may be extended from outside the NMR probe to the second partition member disposed above the sealing member within the inner container, and an opening formed at an end of the outlet pipe is oriented to be open toward a partial space located above the second partition member. According to this configuration, the refrigerant gas discharged from the rotation mechanism is retained in the partial space above the partition member and naturally released from the opening opened toward the partial space. Natural release of the refrigerant gas is facilitated by retaining the refrigerant gas in the partial space.

Preferably, the NMR probe according to another aspect of the present invention further includes a gas convection regulating member for regulating convection of the gas filled in the partial space between the second partition member and the sealing member. With this configuration, convection of the refrigerant gas is suppressed in the partial space, which can, in turn, prevent thermal conduction from the refrigerant gas released in the partial space to the refrigerant gas contained in the feed pipe and in the outlet pipe.

Preferably, the outer structure may include an outer container surrounding the inner container and a bottom unit disposed on a lower side of the outer container, the vacuum insulation space may include a first chamber formed between the outer container and the inner container and a second chamber formed below the sealing member inside the bottom unit, and the second chamber is communicated with both the first vacuum insulation space and the second vacuum insulation space. When the sample is replaced, the outer and inner containers are detached. In this case, the first chamber is vented to the atmosphere, while the second chamber is not vented to the atmosphere. For this reason, the second chamber is maintained in a vacuum state, while the first and second vacuum insulation spaces communicating with the second chamber are also maintained in the vacuum state. According to this configuration, the vacuum state can be locally maintained even after the inner container is detached.

Preferably, a substance having an unpaired electron may be added to the sample, and a nuclear magnetic resonance signal is detected from the sample while the sample is radiated with a microwave.

According to the present invention, the sample can be cooled effectively in the NMR probe used for dynamic nuclear polarization.

BRIEF DESCRIPTION OF THE DRAWINGS

The present invention will be further described with reference to the accompanying drawings, wherein like reference numerals refer to like parts in the several views, and wherein.

DESCRIPTION OF THE EMBODIMENT

Figure 1:
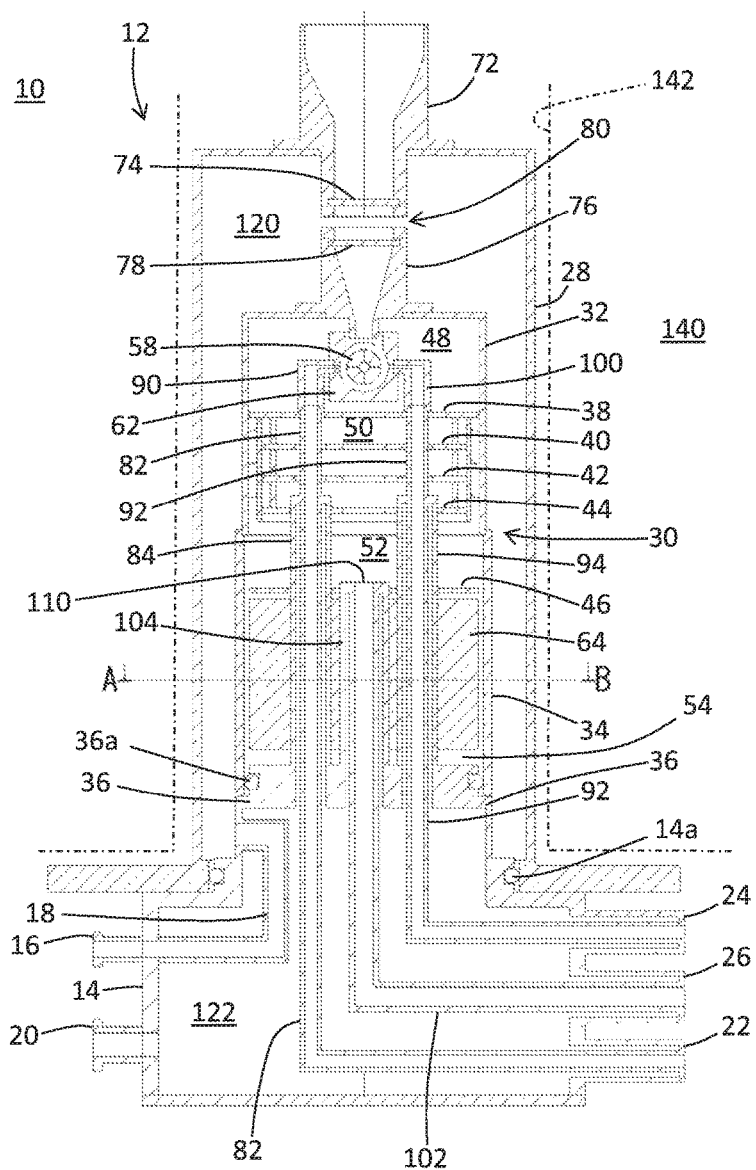
FIG. 1 is a cross sectional view of an NMR probe according to an embodiment of this invention.

FIG. 1 shows an NMR probe according to an embodiment of this invention. The NMR probe 10 is used, for example, for analyzing the molecular structure of a sample. In this embodiment, the sample is a solid sample. The NMR probe 10 according to this embodiment is used, for example, in an NMR apparatus in which dynamic nuclear polarization (DNP) is applied.

The NMR probe 10 is composed of an insertion part 12 and a bottom unit 14. The insertion part 12 is formed in a cylindrical shape generally elongated in a vertical direction, and inserted in a bore 142 of a static magnetic field generator 140. The NMR probe 10 includes an outer container 28 and an inner container 30 arranged inside the outer container 28. Within the inner container 30, there are provided a sample rotor 58 and an air bearing type rotation mechanism 62 for blowing a refrigerant gas (composed of a bearing gas and a driving gas) onto the sample rotor 58 to thereby rotate the sample rotor 58. Hereinafter, components of the NMR probe 10 will be described respectively.

The outer container 28 is, for example, a cylindrically shaped bulkhead. The outer container 28 is inserted into the bore 142 of the static magnetic field generator 140. The outer container 28 has an upper end surface which is airtightly connected to an external waveguide pipe 72, and a lower end surface which is airtightly connected to the bottom unit 14. More specifically, an opening is formed in the upper end surface of the outer container 28, and the external waveguide pipe is inserted into the opening. The external waveguide pipe 72 is mechanically fixed via a seal member such as an indium seal to the upper end surface of the outer container 28. In this way, airtightness is ensured at the upper end surface of the outer container 28. On the other hand, a lower end of the outer container 28 is open, and in the open part, a flange of the bottom unit 14 is inserted. A side surface of the flange is equipped with an O-ring seal 14a. The outer container 28 is mechanically fixed via the O-ring seal 14a to the bottom unit 14. In this way, airtightness is secured at the lower end surface of the outer container 28.

An upper airtight chamber 120 is formed between the outer container 28 and the inner container 30. The interior of the upper airtight chamber 120 is in a vacuum state. The interior of the upper airtight chamber 120 is decompressed, for example, to a pressure of $10^{-3}$ Pa or below.

The bottom unit 14 is, for example, a box shaped bulkhead. The bottom unit 14 is not inserted into the bore 142 of the static magnetic field generator 140. The bottom unit 14 is airtightly connected at its upper end surface to the outer container 28. Within the bottom unit 14, a lower airtight chamber 122 is formed below a sealing bulkhead 36. The interior of the lower airtight chamber 122 is in the vacuum state, and is decompressed, for example, to a pressure of $10^{-3}$ Pa or below.

The bottom unit 14 is equipped with an upper vacuum port 16, a vent pipe 18, a lower vacuum port 20, a bearing gas feed port 22, a driving gas feed port 24, and an outlet port 26.

A pressure reducing line including a vacuum pump and other components is attached to the upper vacuum port 16. One end of the vent pipe 18 is airtightly joined to an internal space of the outer container 28; i.e. the upper airtight chamber 120, and the other end of the vent pipe 18 is joined to the upper vacuum port 16. The interior of the upper airtight chamber 120 is decompressed through the upper vacuum port 16 and the vent pipe 18.

The lower vacuum port 20 is airtightly joined to the lower airtight chamber 122. A pressure reducing line including a vacuum pump is attached to the lower vacuum port 20. The interior of the lower airtight chamber 122 is decompressed via the lower vacuum port 20.

The bearing gas feed port 22 is airtightly joined, to a below-described bearing gas feed pipe 82. The driving gas feed port 24 is airtightly joined to a below-described driving gas feed pipe 92. The outlet port 26 is airtightly joined to a below-described gas outlet pipe 102. Details of the feed pipes 82, 92 and the outlet pipe 102 will be described further below.

Next, the structure of the inner container 30 is described. The inner container 30 has an upper bulkhead 32 and a lower bulkhead 34.

The upper bulkhead 32 and the lower bulkhead 34 are cylindrically shaped bulkheads. The upper bulkhead 32 is open at its lower end part, while the lower bulkhead 34 is open at its upper and lower end parts. The upper end part of the lower bulkhead 34 is bonded to the lower end part of the upper bulkhead 32. Airtightness at these parts is secured by the bonding. The sealing bulkhead 36 is inserted into the lower end part of the lower bulkhead 34. An O-ring seal 36a is disposed on a side surface of the sealing bulkhead 36. The sealing bulkhead 36 is mechanically fixed via the O-ring seal 36a to the lower end part of the lower bulkhead 34. In this way, airtightness is ensured at the lower end surface of the inner container 30. Alternatively, the sealing bulkhead 36 may be integrated with the bottom unit 14. An opening is formed in an upper end surface of the upper bulkhead 32, and an internal waveguide pipe 76 is inserted into the opening. The internal waveguide pipe 76 is mechanically fixed via a seal member to the upper end surface of the upper bulkhead 32, to thereby ensure airtightness at the upper end surface of the inner container 30.

The upper bulkhead 32 is formed of a metal such as copper. The sample and the sample rotor 58 are placed within the upper bulkhead 32, and the upper bulkhead 32 functions as an electromagnetic shield. In this way, an influence, such as extraneous noise, of an electromagnetic wave can be suppressed or prevented from being exerted on a transmitting and receiving coil. The lower bulkhead 34 is formed of resin such as fiber reinforced plastic (FRP).

An airtight chamber independent of both the upper airtight chamber 120 and the lower airtight chamber 122 is formed within the inner container 30. Accordingly, the inner container 30 is a container for partitioning the interior of the outer container 28 into the airtight chamber within the inner container 30, the upper airtight chamber 120, and the lower airtight chamber 122.

The airtight chamber within the inner container 30 is separated into a sample chamber 48, a detection circuit chamber 50, an auxiliary chamber 52, and a heat insulation area 54 by partition members, such as a partition member 38. Specifically, the sample chamber 48 is separated from the detection circuit chamber 50 by the partition member 38. The detection circuit chamber 50 is separated from the auxiliary chamber 52 by a partition member 44. The auxiliary chamber 52 is separated from the heat insulation area 54 by a partition member 46. The detection circuit chamber 50 is arranged below the sample chamber 48. The auxiliary chamber 52 is arranged below the detection circuit chamber 50. The heat insulation area 54 is arranged below the auxiliary chamber 52.

The sample rotor 58 and the air bearing type rotation mechanism 62 are installed inside the sample chamber 48. When the DNP method is employed, radicals (substances having unpaired electrons) are added to the sample. A mixture of the sample and the radicals is placed within the sample rotor 58. The insertion part 12 is inserted into the bore 142 of the static magnetic field generator 140 in such a manner that the mixture and the center of the sample rotor 58 are aligned with the center of a magnetic field. When the sample is a solid object, the sample rotor 58 is rotatably placed in a position inclined at a predetermined angle of inclination (at a so-called "magic angle"). The sample rotor 58 is rotated by supplying the air bearing type rotation mechanism 62 with compressed gas. As an example, the sample rotor 58 is rotated at a rotation speed of a few to few tens of kHz. In this embodiment, the refrigerant gas (composed of the bearing gas and the driving gas) is supplied from outside the NMR probe 10 through the bearing gas feed pipe 82 and the driving gas feed pipe 92 to the air bearing type rotation mechanism 62. For the refrigerant gas, a helium gas that is cooled, for example, to a temperature of 20K or below is used. The air bearing type rotation mechanism 62 blows the refrigerant gas onto the sample rotor 58 to rotate the sample rotor 58. While being rotated, the sample rotor 58 is simultaneously cooled by the blown refrigerant gas. In this way, the mixture (of the sample and radicals) placed inside the sample rotor 58 is cooled. The refrigerant gas discharged from the air bearing type rotation mechanism 62 spreads out into the sample chamber 48. For this reason, it can be said that the sample and the sample rotor 58 are placed within a refrigerant gas space. The sample rotor 58 and the air bearing type rotation mechanism 62 will be described in detail further below.

Electronic components (such as, for example, a variable capacitor) constituting a detection circuit for measuring the NMR signal are placed within the detection circuit chamber 50. The detection circuit includes, in addition to the transmitting and receiving coil, variable capacitors for tuning and for matching and other components. That is, the detection circuit has a tuning circuit and a matching circuit. In this embodiment, for example, the variable capacitors for tuning and for matching and other components are placed within the detection circuit chamber 50. Operation characteristics of the detection circuit are optimized by changing the capacitance of the variable capacitors. This means that frequency tuning and impedance matching are performed. It should be noted that the interior of the detection circuit chamber 50 may be partitioned into several spaces by partition members 40 and 42.

The partition members 38 to 44 have through holes bored along a vertical direction. The through holes function as refrigerant gas passages. The refrigerant gas discharged from the air bearing type rotation mechanism 62 into the sample chamber 48 passes through the through holes, and naturally flows into the auxiliary chamber 52.

The heat insulation area 54 is formed between the partition member 46 and the sealing bulkhead 36. The heat insulation area 54 is filled with a gas flow regulating member 64. As the gas flow regulating member 64, a foam material such as, for example, urethane may be used. Convection of the refrigerant gas is regulated by the gas flow regulating member 64. Note that when the sample is replaced, the inner container 30 (the upper bulkhead 32 and the lower bulkhead 34) is detached. It is therefore preferable that the gas flow regulating member 64 is composed of a material capable of retaining its original shape even after detachment of the inner container 30.

Through holes through which the bearing gas feed pipe 82 is extended are formed in the sealing bulkhead 36 and the partition members 38 to 46. The bearing gas feed pipe 82 is extended through all of the through holes to the air bearing type rotation mechanism 62. One end of the bearing gas feed pipe 82 is connected to the bearing gas feed port 22, and the other end of the bearing gas feed pipe 82 is attached to a nozzle 90. The nozzle 90 is arranged within the sample chamber 48. The bearing gas is supplied from outside the NMR probe 10 and fed through the bearing gas feed port 22 into the bearing gas feed pipe 82. The bearing gas is used for rotatively actuating the sample rotor 58. The bearing gas may be, for example, helium gas whose temperature is reduced to 20K or below. The bearing gas is fed from the bearing gas feed pipe 82 via the nozzle 90 to the air baring type rotation mechanism 62.

Further, through holes through which the driving gas feed pipe 92 is extended are formed in the sealing bulkhead 36 and the partition members 38 to 46. The driving gas feed pipe 92 is extended through all of the through holes to the air bearing type rotation mechanism 62. One end of the driving gas feed pipe 92 is connected to the driving gas feed port 24, and the other end of the driving gas feed pipe 92 is attached to a nozzle 100. The nozzle 100 is arranged within the sample chamber 48. The driving gas is supplied from outside the NMR probe 10 and fed through the driving gas feed port 24 into the driving gas feed pipe 92. The driving gas is used for applying a turning force to the sample rotor 58. The driving gas is directed to impinge onto a turbine of the sample rotor 58. The driving gas may be, for example, helium gas whose temperature is reduced to 20K or below. The driving gas is fed from the driving gas feed pipe 92 via the nozzle 100 to the air bearing type rotation mechanism 62.

Still further, through holes through which the gas outlet pipe 102 is extended are formed in the sealing bulkhead 36 and the partition member 46. The gas outlet pipe 102 is extended through the through holes into the partition member 46. One end of the gas outlet pipe 102 is connected to the outlet port 26, and the other end of the gas outlet pipe 102 is open. An opening 110 defined at the other end of the gas outlet pipe 102 is oriented to be open toward the auxiliary chamber 52. The refrigerant gas inside the auxiliary chamber 52 is discharged through the gas outlet pipe 102 to the outside of the NMR probe 10.

One end (a lower end part) of the external waveguide pipe 72 is oriented to be open toward a space (the upper airtight chamber 120) inside the outer container 28. A microwave supplied from a non-illustrated microwave generator installed outside the NMR probe 10 is directed from the other end of the external waveguide pipe 72 into the external waveguide pipe 72. The microwave is used for exciting electron spin resonance in the radicals added to the sample. The frequency of the microwave depends on the strength of a static magnetic field. For example, when the strength of the static magnetic field is 14 T, a microwave having a frequency of several hundred GHz (for example, approximately 400 GHz) is used. The microwave propagating within the external waveguide pipe 72 is emitted from the lower end of the external waveguide pipe 72 into the interior of the outer container 28. The lower end of the external waveguide pipe 72 is provided with a window member 74 through which the microwave is transmitted. The window member 74 is formed of ceramic such as, for example, $Si_3N_4$. The window member 74 also functions as a vacuum wall. That is, the interior of the external waveguide pipe 72 is in an atmospheric state, while the interior of the upper airtight chamber 120 is in a vacuum state. The upper airtight chamber 120 is isolated from the atmosphere by the window member 74, to thereby maintain the vacuum state inside the upper airtight chamber 120. It should be noted that when an internal width of the external wave guide 72 is defined to be greater than the wavelength of the microwave, transmission losses of the microwave can be minimized.

The internal waveguide pipe 76 is spaced apart from the external waveguide pipe 72. An upper end of the internal waveguide pipe 76 is opposed to the lower end of the external waveguide pipe 72. The upper end of the internal waveguide pipe 76 is equipped with a window member 78 through which the microwave is transmitted. The window member 78 is formed of ceramic such as, for example, $Si_3N_4$. The window member 78 also functions as a vacuum wall. A lower end of the internal waveguide pipe 76 is open and oriented to be open toward the interior of the sample chamber 48. The lower end of the internal waveguide pipe 76 is opposed to the sample rotor 58. The interior of the internal waveguide pipe 76 communicates with the sample chamber 48 and cooled by the refrigerant gas. The interior of the internal waveguide pipe 76 is separated from the upper airtight chamber 120 by the window member 78 disposed on the upper end of the internal waveguide pipe 76. In this way, the vacuum state inside the upper airtight chamber 120 is maintained. Further, a gap space 80 is defined between the internal waveguide pipe 76 and the external waveguide pipe 72. The internal waveguide pipe 76 has a tapered shape in its inside. In other words, the internal width of the internal waveguide pipe 76 is gradually narrowed from the upper end toward the lower end, so that a smaller emission spot of the microwave can be obtained. This can allow the sample of a smaller size to be accurately irradiated with the microwave, and can accordingly prevent components other than the sample from being exposed to the microwave. In this way, a temperature rise resulting from microwave emission can be avoided. The microwave emitted from the lower end of the external waveguide pipe 72 propagates through the gap space 80 into the internal waveguide pipe 76. The microwave having propagated through the internal waveguide pipe 76 is transmitted from the lower end of the internal waveguide pipe 76 to the interior of the sample rotor 58. As a result, the sample within the sample rotor 58 is irradiated with the microwave. The temperature inside the external waveguide pipe 72 is room temperature. The interior of the internal waveguide pipe 76 is cooled by the refrigerant gas. The gap space 80 defined between the external waveguide pipe 72 and the internal waveguide pipe 76 functions as a heat insulation space. Due to this function, a low temperature condition within the inner container 30 is maintained.

Figure 2:
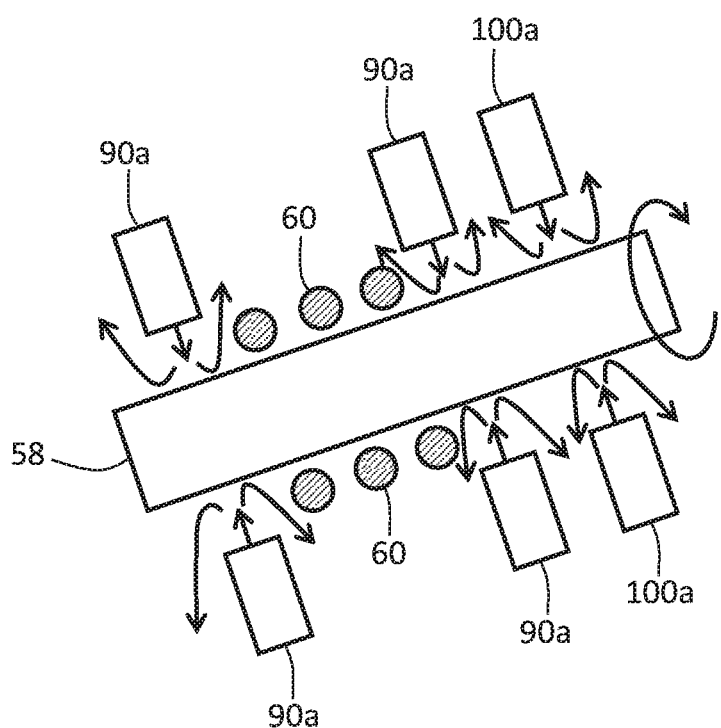
FIG. 2 is a schematic diagram showing an example of a sample rotor.

FIG. 2 schematically shows the sample rotor 58. The mixture of the radicals and the sample to be measured is placed within the sample rotor 58. The sample is a solid sample. A transmitting and receiving coil 60 is disposed so as to surround the mixture and the sample rotor 58. The transmitting and receiving coil 60 is shaped like a solenoid, for example. The transmitting and receiving coil is connected to the electronic components such as capacitors placed in the detection circuit chamber 50. For transmission, a radio frequency signal (RF transmission signal) for NMR measurement is generated and supplied to the transmitting and receiving coil 60. The frequency of the RF transmission signal is determined based on a nuclide to be observed. The RF transmission signal of approximately 700 MHz, for example, is supplied to the transmitting and receiving coil 60. An RF transmission signal having a frequency other than 700 MHz may, of course, be used. A variable magnetic field generated with the transmitting and receiving coil 60 is applied to the sample. The transmitting and receiving coil 60 detects, at the time of reception, an NMR signal from the sample. A transmitter coil and a receiver coil, which are separate from each other, may be disposed in place of the transmitting and receiving coil 60. When the DNP method is employed, the microwave is continuously radiated through the external waveguide pipe 72 and the internal waveguide pipe 76 onto the mixture, to thereby excite electron spin resonance in the radicals. Then, polarization of an electron spin is transferred to polarization of a nuclear spin of the sample, which leads to an increased strength of the NMR signal. The transmitting and receiving coil 60 detects the NMR signal having the increased strength.

As the air bearing type rotation mechanism 62, a rotation mechanism described in, for example, JP 2003-177172 or JP 2008-241493 may be used. The air bearing type rotation mechanism 62 includes, for example, a non-illustrated housing for retaining the sample rotor 58, and blower nozzles 90*a*, 100*a*. The bearing gas fed through the bearing gas feed pipe 82 and the nozzle 90 is blown from the blower nozzle 90*a* onto the sample rotor 58. Meanwhile, the driving gas fed through the driving gas feed pipe 92 and the nozzle 100 is blown from the blower nozzle 100*a* onto the sample rotor 58. The pressure of the bearing gas is higher than an atmospheric pressure by about 0.1 to 0.5 MPa. The pressure of the driving gas is higher than the atmospheric pressure by about 0.1 to 0.3 MPa. With the pressures, the sample rotor 58 is rotated at a rotation speed of several kHz to several tens of kHz, while the mixture and the sample rotor 58 are simultaneously cooled to lower temperatures (of, for example, 20K or below). After the refrigerant gas (composed of the bearing gas and the driving gas) is blown onto the sample rotor 58, the pressure of the refrigerant gas becomes higher than the atmospheric pressure by approximately 0.03 MPa.

Figure 3:
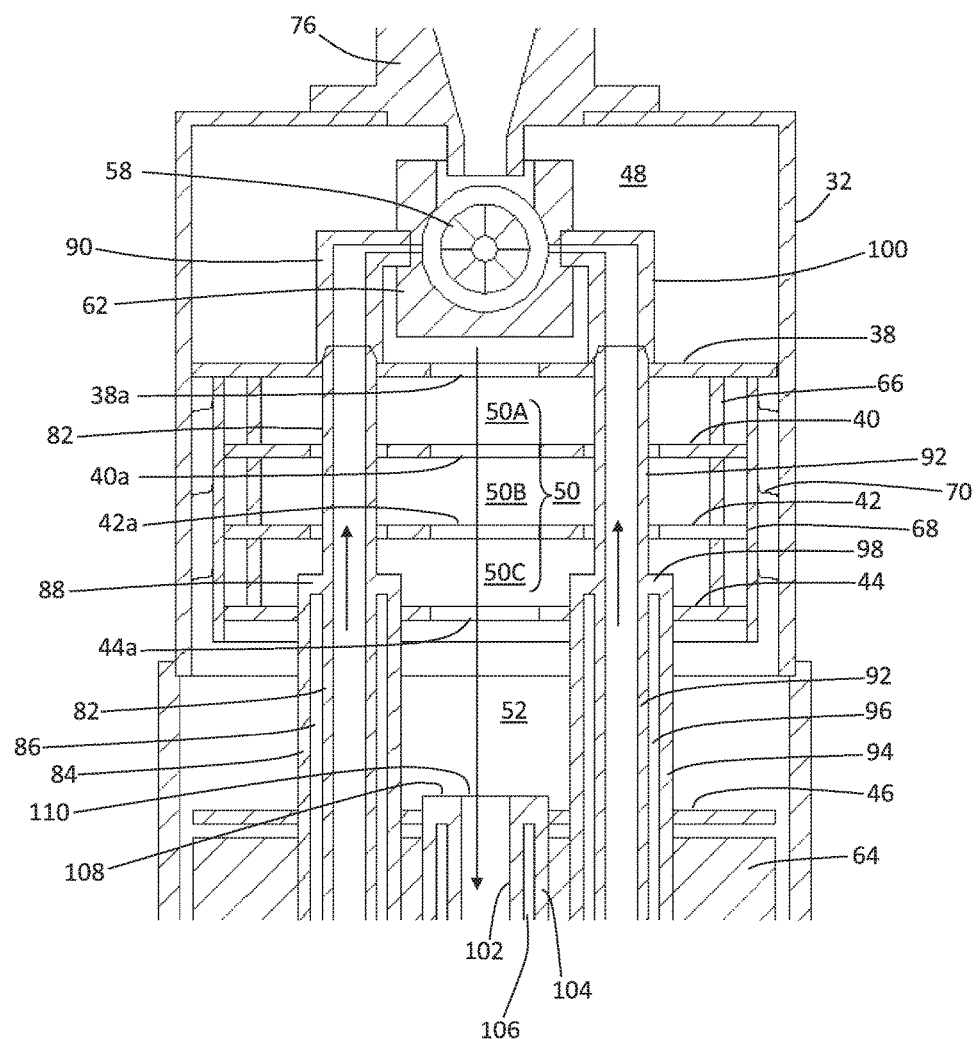
FIG. 3 is an enlarged cross sectional view of a sample chamber and a detection circuit chamber.

FIG. 3 shows an enlarged view of the sample chamber and the detection circuit chamber. The sample chamber 48 is separated from the detection circuit chamber 50 by the partition member 38. In the example shown in FIG. 3, the detection circuit chamber 50 includes a circuit chamber 50A and auxiliary circuit chambers 50B, 50C. For example, the circuit chamber 50A is separated from the auxiliary circuit chamber 50B by the partition member 40, and the auxiliary circuit chamber 50B is separated from the auxiliary circuit chamber 50C by the partition member 42. The auxiliary circuit chamber 50B is formed below the circuit chamber 50A, and the other auxiliary circuit chamber 50C is formed below the auxiliary circuit chamber 50B. Below the auxiliary circuit chamber 50C, there is the auxiliary chamber 52. The auxiliary circuit chamber 50C is separated from the auxiliary chamber 52 by the partition member 44. The electronic components, such as capacitors, constituting the detection circuit are placed in the circuit chamber 50A. The auxiliary circuit chambers 50B and 50C may be used to accommodate additional electronic components. It should be noted that the auxiliary circuit chambers 50B, 50C may not necessarily be formed.

The partition member 38 is positioned in the vicinity of the sample rotor 58. For this reason, it is preferable that the partition member 38 is formed of resin. The partition members 40, 42, and 44 are formed of unoxidized copper, for example.

The partition member 38 has a through hole 38a which is bored along a vertical direction. The through hole 38a functions as the refrigerant gas passage. The refrigerant gas (of the bearing gas and the driving gas) discharged from the air bearing type rotation mechanism 62 is spread out into the sample chamber 48 and retained within the sample chamber 48. The refrigerant gas retained within the sample chamber 48 is subsequently released naturally from the through hole 38a into the circuit chamber 50A. The through hole 38a enables the natural release of the refrigerant gas. In other words, the through hole 38a functions as an escape vent through which the refrigerant gas is naturally released. The refrigerant gas released via the through hole 38a into the circuit, chamber 50A is blown onto the electronic components, such as capacitors, housed in the circuit chamber 50A. In this way, the electronic components are cooled down.

The partition member 40 has a through hole 40a which is bored along the vertical direction. The partition member has a through hole 42a bored along the vertical direction. The partition member 44 has a through hole 44a bored along the vertical direction. The refrigerant gas released into the circuit chamber 50A passes through the through holes, and flows into the auxiliary chamber 52. In this way, the interiors of the auxiliary circuit chambers 50B, 50C and the auxiliary chamber 52 are all cooled by the refrigerant gas. In this embodiment, the interiors of the sample chamber 48, the detection circuit chamber 50, and the auxiliary chamber 52 are all cooled by the refrigerant gas.

In the example shown in FIG. 3, column members 66 for supporting the partition members 38 to 44 are provided. Further, a shield member 68 is disposed so as to enclose the detection circuit chamber 50. The shield member 68 is a cylindrically shaped member. The shield member 68 may be formed of a copper plate, for example. The shield member 68 is electrically connected via a flat spring 70 to the upper bulkhead 32. This connection allows the partition members 38 to 44 to be grounded.

The partition members 38 to 46 have through holes penetrated by the bearing gas feed pipe 82. The bearing gas feed pipe 82 is extended through all of the through holes to the air bearing type rotation mechanism 62. In the example shown in FIG. 3, the diameters of the through holes defined in the partition members 38, 40, and 42 are greater than the outer diameter of the bearing gas feed pipe 82. The diameters of the through holes defined in the partition members 44 and 46 are greater than the outer diameter of a below-described sheath member 84. In the example shown in FIG. 3, no gap is defined between the partition member 38 and the bearing gas feed pipe 82. On the other hand, gaps may be defined between the partition members 40, 42 and the bearing gas feed pipe 82. The refrigerant gas is downwardly discharged also through the gaps.

The partition members 38 to 46 have further through holes penetrated by the driving gas feed pipe 92. The driving gas feed pipe 92 is extended through all of the through holes to the air bearing type rotation mechanism 62. In the example shown in FIG. 3, the diameters of the through holes defined in the partition members 38, 40, and 42 are greater than the outer diameter of the driving gas feed pipe 92. The diameters of the through holes defined in the partition members 44 and 46 are greater than the diameter of a below-described sheath member 94. In the example shown in FIG. 3, no gap is defined between the partition member 38 and the driving gas feed pipe 92. On the other hand, gaps may be defined between the partition members 40, 42 and the driving gas feed pipe 92. The refrigerant gas is also downwardly discharged through the gaps.

In the partition member 46, a through hole penetrated by the gas outlet pipe 102 is defined. The gas outlet pipe 102 is extended into the partition member 46. An end of the gas outlet pipe 102 is open, and an opening 110 defined at the end is opened toward the interior of the auxiliary chamber 52. The diameter of the through hole defined in the partition member 46 is equal to the diameter of a below-described sheath member 104. In this way, the partition member 46 and the sheath member 104 are intimately contacted to each other without a gap.

The nozzles 90, 100 are placed within the sample chamber 48. One end of each of the nozzles 90, 100 is opposed to the sample rotor 58. The other end of the nozzle 90 is coupled to the end of the bearing gas feed pipe 82, and the other end of the nozzle 100 is coupled to the end of the driving gas feed pipe 92.

The sheath member 84 is arranged so as to sheathe the bearing gas feed pipe 82 with a gap 86 defined between the bearing gas feed pipe 82 and the sheath member 84. The gap communicates, as described below, with the lower airtight chamber 122. For this reason, the gap 86 is in a vacuum state, which allows the gap 86 to function as a vacuum insulation space. This function prevents a temperature rise of the refrigerant gas contained within the bearing gas feed pipe 82. An upper end 88 of the sheath member 84 is sealed, to secure airtightness inside the gap 86 (vacuum insulation space) at the upper end 88.

Meanwhile, the sheath member 94 is arranged so as to sheathe the driving gas feed pipe 92 with a gap 96 defined between the driving gas feed pipe 92 and the sheath member 94. The gap 96 communicates, as described below, with the lower airtight chamber 122. For this reason, the gap 96 is in the vacuum state, which allows the gap 86 to function as the vacuum insulation space. This function prevents a temperature rise of the refrigerant gas contained within the driving gas feed pipe 92. An upper end 98 of the sheath member 94 is also sealed, to thereby secure airtightness inside the gap 96 (vacuum insulation space) at the upper end 98.

Still further, the sheath member 104 is arranged so as to sheathe the gas outlet pipe 102 with a gap 106 defined between the gas outlet pipe 102 and the sheath member 104.

The gap 106 communicates, as described below, with the lower airtight chamber 122. For this reason, the gap 106 is in the vacuum state, which allows the gap 106 to function as a vacuum insulation space. This function prevents a temperature rise of the refrigerant gas contained within the gas outlet pipe 102. An upper end 108 of the sheath member 104 is also sealed, to thereby secure airtightness inside the gap 106 (vacuum insulation space) at the upper end 108.

The sheath members 84, 94, and 104 are formed of low-thermal-conductivity material having high strength (rigid material). For example, the sheath members 84, 94, and 104 may be formed of stainless, stainless steel (SUS), or the like. The use of the low-thermal-conductivity material for the sheath members 84, 94, and 104 can help avoid a temperature rise of the refrigerant gas contained within the bearing gas feed pipe 82, the driving gas feed pipe 92, and the gas outlet pipe 102. The inner container 30 is detached to replace the sample. The use of the high-strength (rigid) material for the sheath members 84, 94, and 104 allows the sheath members 84, 94, and 104 to function as a framework. In this way, the components placed within the inner container 30 are prevented from rattling.

Note that there is a gap between the partition member 46 and the lower bulkhead 34. Because of the necessity of removing the inner container 30 when the sample is replaced, that gap is not sealed. This allows the refrigerant gas in the auxiliary chamber 52 to enter, through the gap, the heat insulation area 54. The presence of the refrigerant gas within the heat insulation area 54 causes convection (vertical convection) of the refrigerant gas between the sealing bulkhead 36 which is at a normal room temperature and the partition member 44 which is cooled to a lower temperature, resulting in an increased rate of thermal conduction. In this embodiment, the gas flow regulating member 64 is placed within the heat insulation area 54. This can prevent convection of the refrigerant gas in the heat insulation area 54.

Figure 4:
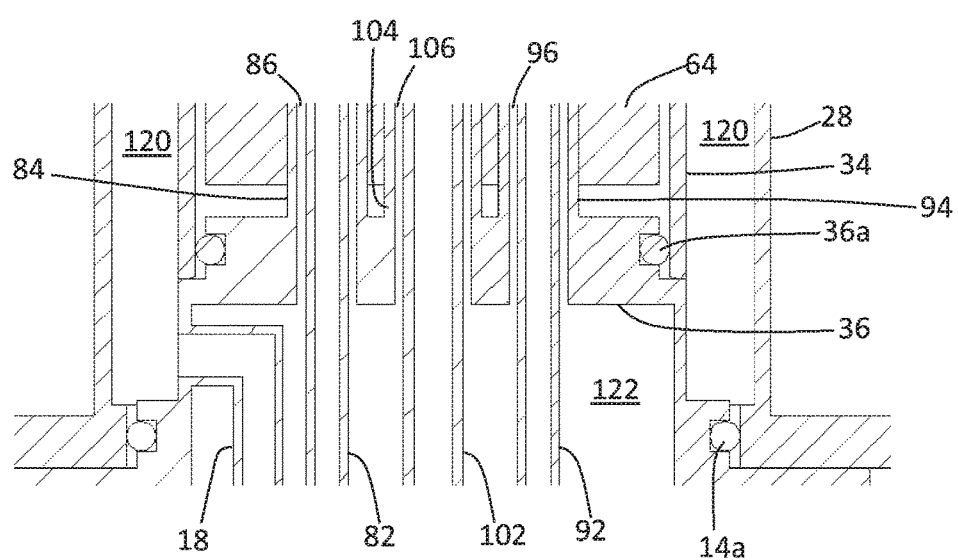
FIG. 4 is an enlarged cross sectional view showing a base end side of an inner container.

FIG. 4 shows an enlarged view of the lower end (on a base end side) of the inner container 30. A lower end surface of the sheath member 84 is joined to an upper end of the sealing bulkhead 36. The gap 86 remains open at the lower end of the sheath member 84. A through hole penetrated by the bearing gas feed pipe 82 is bored in the sealing bulkhead 36. The diameter of the through hole is greater than the outer diameter of the bearing gas feed pipe 82. Because of this, there is a clearance between the bearing gas feed pipe 82 and the sealing bulkhead 36 within the through hole. Through this clearance from the sealing bulkhead 36, the gap 86 communicates with the lower airtight chamber 122. Therefore, the gap 86 is in the vacuum state.

A lower end of the sheath member 94 is also joined to the upper end surface of the sealing bulkhead 36. The gap 96 remains open at the lower end of the sheath member 94. Another through hole penetrated by the driving gas feed pipe 92 is bored in the sealing bulkhead 36. The diameter of the through hole is greater than the outer diameter of the driving gas feed pipe 92. Because of this, a clearance is obtained between the driving gas feed pipe 92 and the sealing bulkhead 36 within the through hole. Through this clearance from the sealing bulkhead 36, the gap 96 is communicated with the lower airtight chamber 122. Therefore, the gap 96 is in the vacuum state.

A lower end of the sheath member 104 is also joined to the upper end surface of the sealing bulkhead 36. The gap 106 remains open at the lower end of the sheath member 104. A further through hole penetrated by the gas outlet pipe 102 is bored in the sealing bulkhead 36. The diameter of the through hole is greater than the outer diameter of the gas outlet pipe 102. Because of this, a clearance is obtained between the gas outlet pipe 102 and the sealing bulkhead 36 within the through hole. Through this clearance from the sealing bulkhead 36, the gap 106 communicates with the lower airtight chamber 122. Therefore, the gap 106 is in the vacuum state.

As described above, the gap 86 is extendedly defined from the sealing bulkhead 36 to the upper end 88 (sealed portion) of the sheath member 84. The gap 96 is extendedly defined from the sealing bulkhead 36 to the upper end 98 (sealed portion) of the sheath member 94. The gap 106 is extendedly defined from the sealing bulkhead 36 to the upper end 108 (sealed portion) of the sheath member 104. A vacuum insulation space is defined in the range where the gaps are present.

Figure 5:
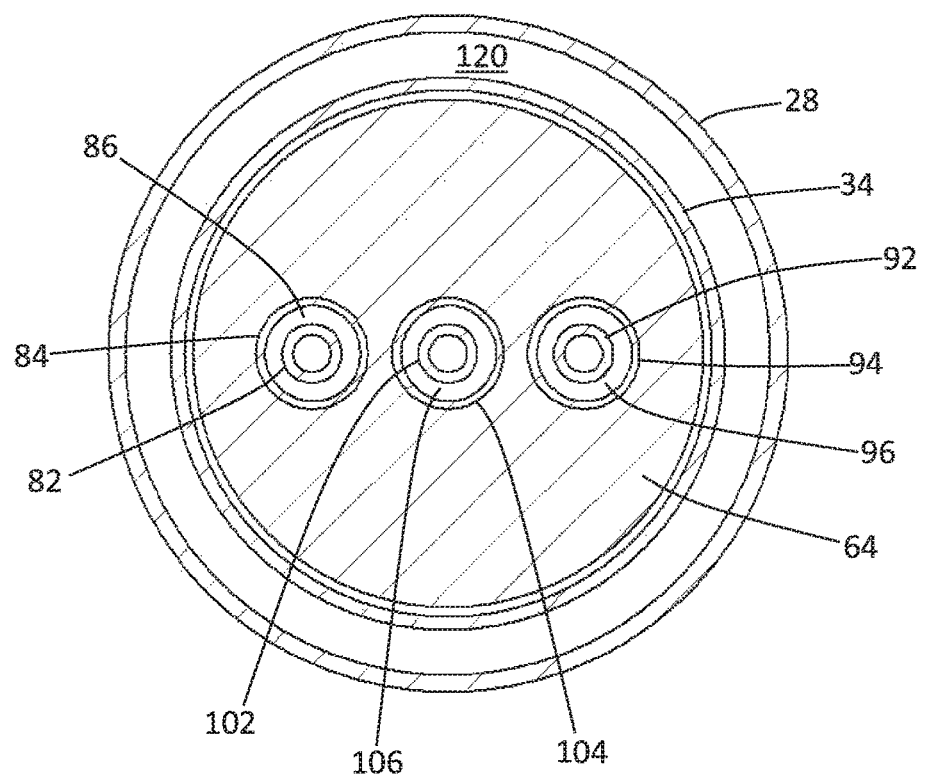
FIG. 5 is a cross sectional view taken along line A-B in FIG. 1.

FIG. 5 shows a cross sectional view taken along line A-B in FIG. 1. The upper airtight chamber 120 is formed between the outer container 28 and the lower bulkhead 34 (the inner container 30). The sheath member 84 is disposed so as to sheathe the bearing gas feed pipe 82. The gap 86 functioning as the vacuum insulation space is defined between the bearing gas feed pipe 82 and the sheath member 84. The sheath member 94 is disposed so as to sheathe the driving gas feed pipe 92. The gap 96 functioning as the vacuum insulation space is defined between the driving gas feed pipe 92 and the sheath member 94. The sheath member 104 is disposed so as to sheathe the gas outlet pipe 102. The gap 106 functioning as the vacuum insulation space is defined between the gas outlet pipe 102 and the sheath member 104. Further, the gas flow regulating member 64 is filled around the sheath members 84, 94 and 104 inside the lower bulkhead 34.

In this embodiment, the lower unit 14 and the outer container 28 constitute an outer structure. In addition, the inner container 30, the sealing bulkhead 36, and the sheath members 84, 94, and 104 constitute an inner structure. The refrigerant gas is discharged into the inner structure; i.e., a space enclosed by the inner container 30, the sealing bulkhead 36, and the sheath members 84, 94, and 104, to thereby cool down the interior of the inner structure. The temperature inside the inner structure is lowered, for example, to a temperature of 20K or below. The upper and lower airtight chambers 120 and 122 are formed between the outer structure and the inner structure. The interiors of the upper and lower airtight chambers 120 and 122 are decompressed. The pressures of the interiors are reduced, for example, to $10^{-3}$ Pa or below. This allows the upper and lower airtight chambers 120 and 122 to function as vacuum insulation spaces. The interior of the inner structure (refrigerant gas space) is accordingly wrapped by the vacuum insulation spaces. As a result, the temperature rise inside the inner structure is avoided.

Figure 6:
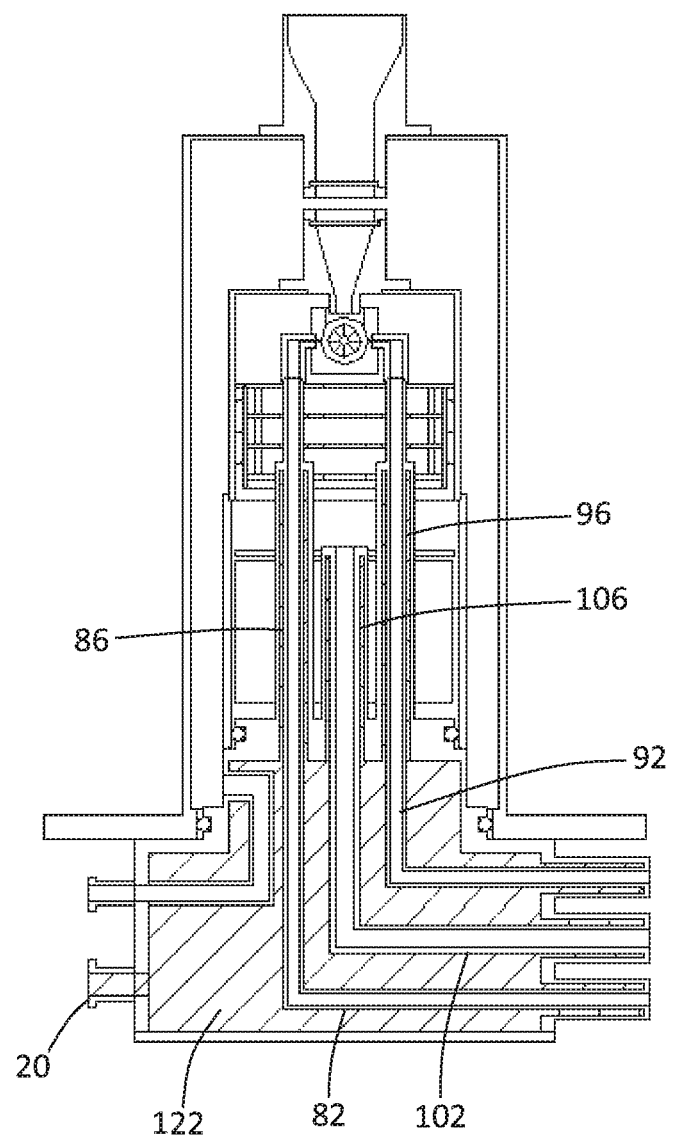
FIG. 6 is a schematic diagram showing vacuum insulation areas.

Next, each function and each condition of the spaces in the NMR probe 10 will be described with reference to FIGS. 6 to 11. FIG. 6 shows pipe vacuum insulation areas. In FIG. 6, hatched parts represent the pipe vacuum insulation areas. The interiors of the lower airtight chamber 122 and the gaps 86, 96, and 106 are decompressed via the lower vacuum port 20. That is, the hatched parts in FIG. 6 represent the space of decompression. Due to this decompression, the lower airtight chamber 122 and the gaps 86, 96, and 106 are established as the pipe vacuum insulation areas. In other words, the lower airtight chamber 122 and the gaps 86, 96, and 106 function as the vacuum insulation spaces for the bearing gas feed pipe 82, the driving gas feed pipe 92, and the gas outlet pipe 102.

Figure 7:
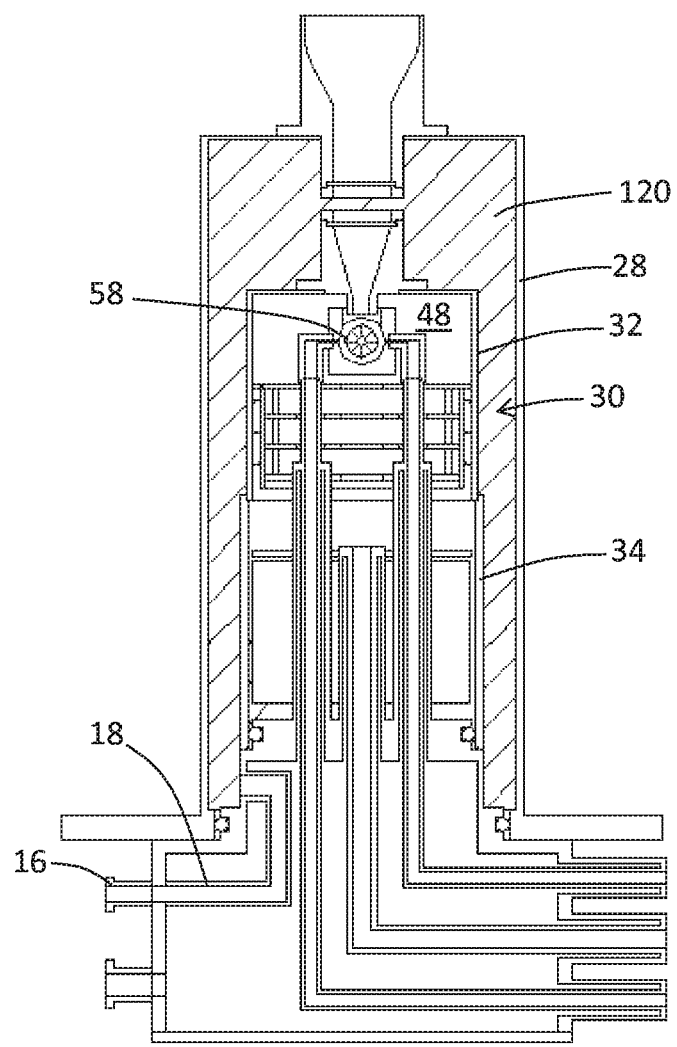
FIG. 7 is a schematic diagram showing a vacuum insulation area.

FIG. 7 shows a sample chamber vacuum insulation area. In FIG. 7, a hatched part represents the sample chamber vacuum insulation area. The interior of the upper airtight chamber 120 is decompressed via the upper vacuum port 16 and the vent pipe 18. The hatched part in FIG. 7 is the space of decompression. Due to this compression, the upper airtight chamber 120 is established as the sample chamber vacuum insulation area. In other words, the upper airtight chamber 120, which is formed so as to surround the sample chamber 48, functions as the vacuum insulation space for the sample chamber 48. Further, the upper airtight chamber 120, which is also formed so as to surround the detection circuit chamber 50, also functions as the vacuum insulation space for the detection circuit chamber 50. In this embodiment, because the inner structure is enclosed by the upper and lower airtight chambers 120 and 122 as described above, both the upper and lower airtight chambers 120 and 122 function as the vacuum insulation space for an internal space of the inner structure (the refrigerant gas space).

Figure 8:
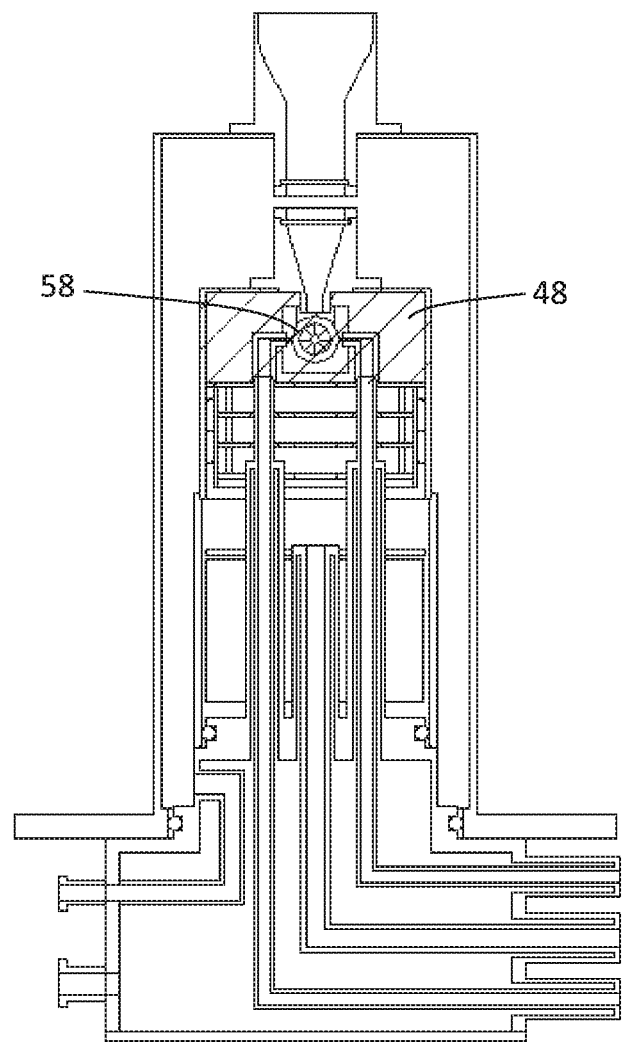
FIG. 8 is a schematic diagram showing a low temperature area.
Figure 9:
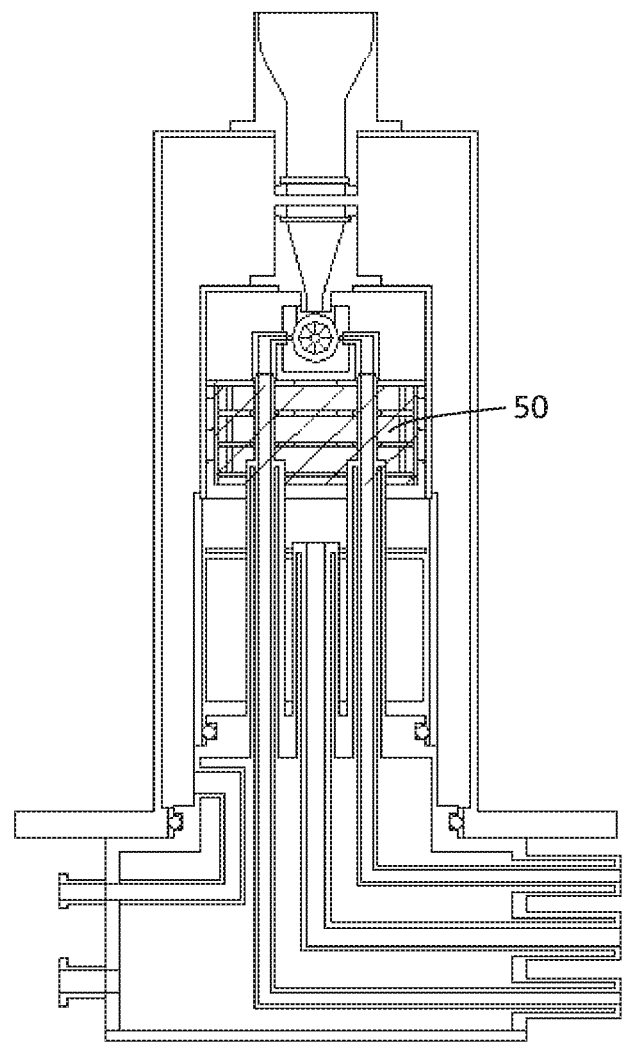
FIG. 9 is a schematic diagram showing a low temperature area.

FIGS. 8 and 9 show low temperature areas. In FIG. 8, a hatched part is the sample chamber 48. This part is cooled by the refrigerant gas (composed of the bearing gas and the driving gas) discharged from the air bearing type rotation mechanism 62, so that the mixture and the sample rotor 58 are cooled. In FIG. 9, a hatched part is the detection circuit chamber 50. This part is cooled by the refrigerant gas naturally released from the sample chamber 48, so that the electronic components, such as capacitors, constituting the detection circuit are cooled.

Figure 10:
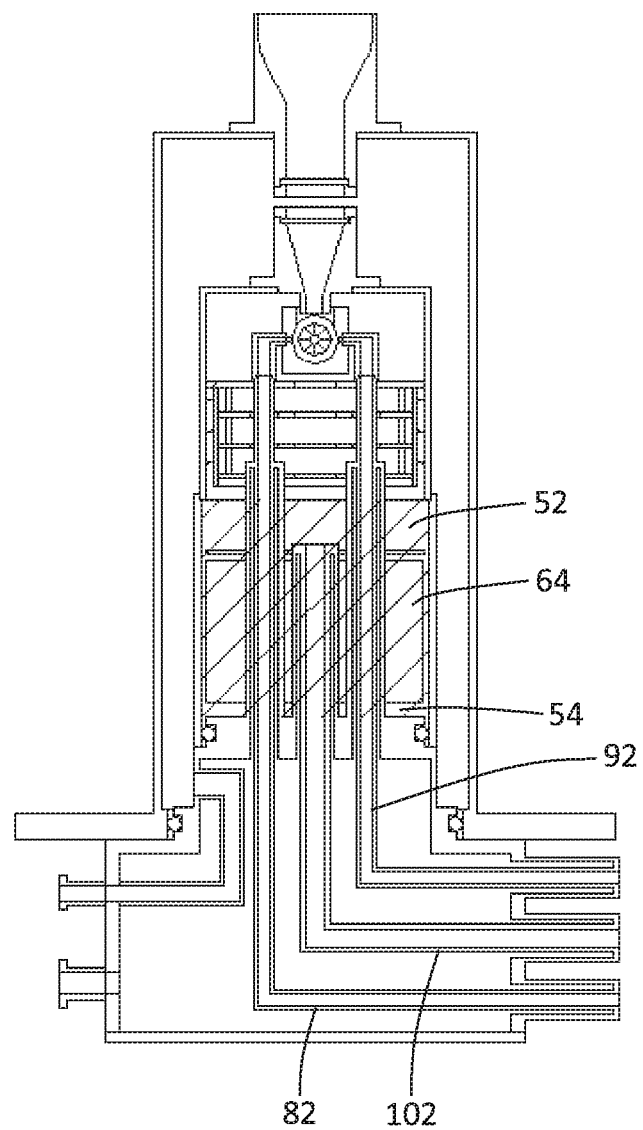
FIG. 10 is a schematic diagram showing a heat insulation area.

FIG. 10 shows other areas. In FIG. 10, a hatched part corresponds to the auxiliary chamber 52 and the heat insulation area 54. The auxiliary chamber 52 is cooled by the refrigerant gas naturally released from the detection circuit chamber 50. The refrigerant gas is discharged from the auxiliary chamber 52 through the gas outlet pipe 102 to outside the NMR probe 10. The heat insulation area 54 is filled with the gas flow regulating member 64.

Figure 11:
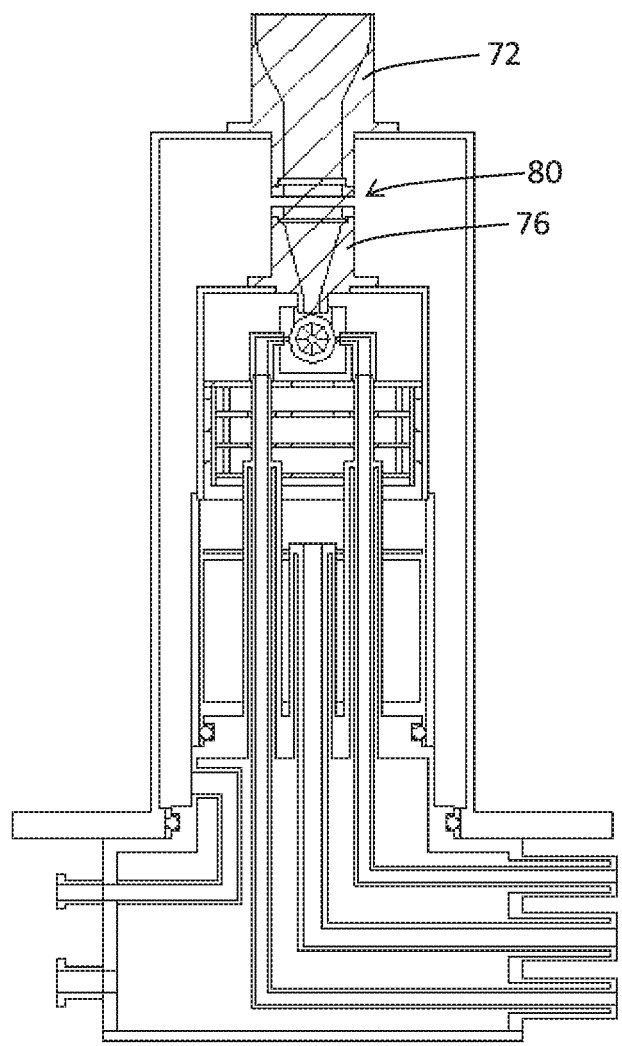
FIG. 11 is a schematic diagram showing a propagation path of a microwave.

FIG. 11 shows a microwave propagation path. In FIG. 11, a hatched part represents the area functioning as the microwave propagation path. The propagation path includes the external waveguide pipe 72 and the internal waveguide pipe 76. The interior of the external waveguide pipe 72 is under atmospheric conditions, and has normal room temperatures. The interior of the internal waveguide pipe 76 is cooled by the refrigerant gas, and has low temperatures (of, for example, 20K or below). The vacuum gap space 80 functions as the heat insulation space, and accordingly prevents thermal conduction from the external waveguide pipe 72 to the internal waveguide pipe 76.

Figure 12:
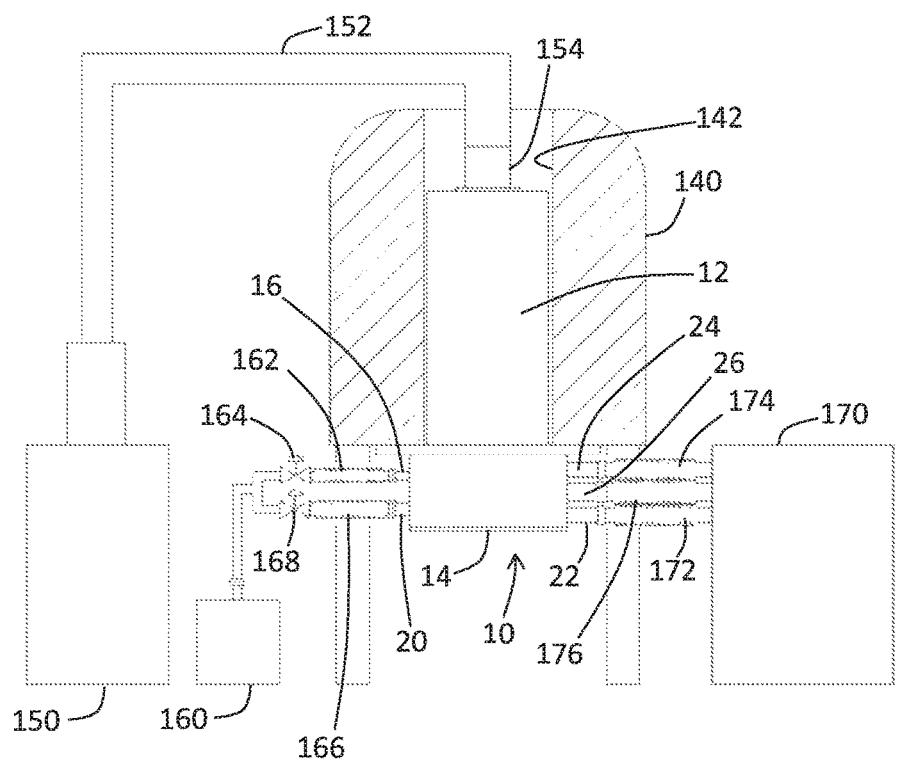
FIG. 12 is a schematic diagram showing an example of an NMR system.

Referring next to FIG. 12, an NMR system according to this embodiment will be described. The insertion part 12 of the NMR probe 10 is inserted into the bore 142 of the static magnetic field generator 140. The bottom unit 14 of the NMR probe 10 is placed outside the bore 142.

A microwave introduction port 154 is connected to the external waveguide pipe 72. One end of a waveguide pipe 152 is connected to the microwave introduction port 154, and the other end of the waveguide pipe 152 is connected to a microwave generator 150. The microwave generator 150 generates the microwave for exciting electron spin resonance. The frequency of the microwave is determined based on measurement details, a radical species, and other factors. For example, the microwave having a frequency of approximately 400 GHz is generated. The microwave having a frequency other than 400 GHz may, of course, be generated. The microwave generated by the microwave generator 150 propagates through the waveguide pipe 152, and enters the external waveguide pipe 72 from the microwave introduction port 154. The microwave further propagates from the external waveguide pipe 72 into the internal waveguide pipe 76. Then, the microwave is emitted from the internal waveguide pipe 76 onto the sample rotor 58.

The upper vacuum port 16 is connected to an upper vent pipe 162 to which an upper valve 164 is joined. The upper valve 164 is a valve arranged between a vacuum pump 160 and the upper airtight chamber 120. The upper valve 164 is, by way of illustration, a hand valve. Alternatively, the upper valve 164 may be another valve, of course. The upper airtight chamber 120 and the vacuum pump 160 can be brought into fluid communication with or blocked from each other by operating the hand valve 164.

The lower vacuum port 20 is connected to a lower vent pipe 166 to which a lower valve 168 is joined. The lower valve 168 is a valve arranged between the vacuum pump 160 and the lower airtight chamber 122. The lower valve 168 may be, for example, a hand valve, or may be another valve, of course. The lower airtight chamber 122 and the vacuum pump 160 can be brought into fluid communication with or blocked from each other by operating the lower valve 168.

The vacuum pump 160 may be implemented, for example, by a turbo-molecular pump. The interiors of the upper airtight chamber 120, the lower airtight chamber 122, and the gaps 86, 96, and 106 are decompressed by the vacuum pump 160.

The bearing gas feed port 22 is connected to one end of a bearing gas introduction pipe 172, and the other end of the bearing gas introduction pipe 172 is connected to a cooling apparatus 170. The bearing gas cooled by the cooling apparatus 170 is fed from the cooling apparatus 170 through the bearing gas introduction pipe 172 to the bearing gas feed port 22. Then, the bearing gas is fed from the bearing gas feed port 22 into the bearing gas feed pipe 82.

The driving gas feed port 24 is connected to one end of a driving gas introduction pipe 174, and the other end of the driving gas introduction pipe 174 is connected to the cooling apparatus 170. The driving gas cooled by the cooling apparatus 170 is fed from the cooling apparatus 170 through the driving gas introduction pipe 174 to the driving gas feed port 22. Then, the driving gas is fed from the driving gas feed port 24 into the driving gas feed pipe 92.

The outlet port 26 is connected to one end of a recovery pipe 176, and the other end of the recovery pipe 176 is connected to the cooling apparatus 170. The refrigerant gas discharged through the gas outlet pipe 102 from inside to outside the NMR probe 10 is delivered through the recovery pipe 176 into the cooling apparatus 170.

A transmitter port and a receiver port are electrically connected to the detection circuit within the NMR probe 10. Through the ports, transmission of a radio wave and receipt of the NMR signal are performed between an NMR spectrometer arranged outside the NMR probe 10 and the detection circuit. The NMR signal is amplified in a preliminary amplifier and subsequently transmitted from the receiver port to a receiver of the NMR spectrometer. In the NMR spectrometer, processing operations such as FFT processing are performed, and a spectrum is displayed on a screen of a display unit.

Note that the NMR probe 10 is equipped with a non-illustrated temperature sensor for detecting temperatures of the components to be cooled, etc.

Figure 13:
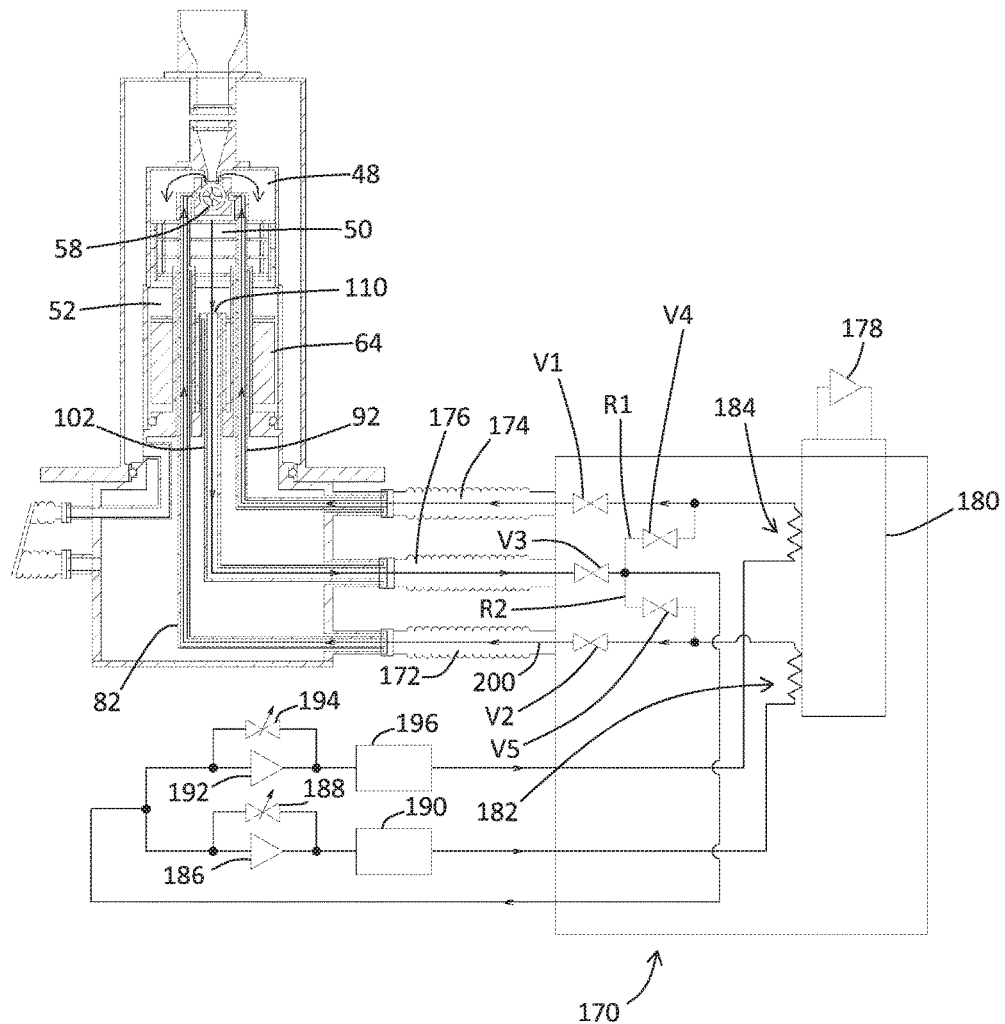
FIG. 13 is a schematic diagram showing an example of a cooling system.

Next, the cooling system according to this embodiment is described with reference to FIG. 13. In this embodiment, a closed loop circulating cooling system is employed as one example. A heat exchanger 182 is connected to the bearing gas introduction pipe 172. A heat exchanger 184 is connected to the driving gas introduction pipe 174. The heat exchangers 182, 184 are in thermal contact with a cold head 180. The cold head 180 is equipped with a helium compressor 178. The heat exchanger 182 is connected to a pump 186, a pressure regulating valve 188, and a flow rate controller 190, while the heat exchanger 184 is connected to a pump 192, a pressure regulating valve 194, and a flow rate controller 196. The pump 186 generates a pressure for delivering the bearing gas, and the pump 192 generates a pressure for delivering the driving gas. The pressure regulating valve 188 is a valve for regulating the pressure of the bearing gas, and the pressure regulating valve 194 is a valve for regulating the pressure of the driving gas. The flow rate controller 190 is a controller for controlling a flow rate of the bearing gas, and the flow rate controller 196 is a controller for controlling a flow rate of the driving gas.

A valve V1 is disposed on a route connecting the heat exchanger 184 to the driving gas introduction pipe 174. When the valve V1 is turned to an "open" state, the refrigerant gas (compressed helium gas) is delivered from the heat exchanger 184 to the driving gas introduction pipe 174. When the valve V1 is turned to a "closed" state, the refrigerant gas is not delivered from the heat exchanger 184 to the driving gas introduction pipe 174. Similarly, a valve V2 is disposed on a route connecting the heat exchanger 182 to the bearing gas introduction pipe 172. When the valve V2 is turned to the "open" state, the refrigerant gas is delivered from the heat exchanger 182 to the bearing gas introduction pipe 172. When the valve V2 is turned to the "closed" state, the refrigerant gas is not delivered from the heat exchanger 182 to the bearing gas introduction pipe 172. Further, a valve V3 is disposed on a route connecting the recovery pipe 176 to the pumps 186, 192. When the valve V3 is turned to the "open" state, the refrigerant gas is delivered from the recovery pipe 176 to the pumps 186 and 192. When the valve V3 is turned to the "closed" state, the refrigerant gas is not delivered from the recovery pipe 176 to the pumps 186 and 192. Still further, the route connecting the heat exchanger 184 to the driving gas introduction pipe 174 is connected via a bypass route R1 to the route connecting the recovery pipe 176 to the pumps 186, 192. A valve V4 is disposed on the bypass route R1. When the valve V4 is turned to the "open" state, the heat exchanger 184 is connected to the pumps 186, 192, while when the valve V4 is turned to the "closed" state, the heat exchanger 184 is disconnected from the pumps 186, 192. Similarly, the route connecting the heat exchanger 182 to the bearing gas introduction pipe 172 is connected via a bypass route R2 to the route connecting the recovery pipe 176 to the pumps 186, 192. A valve V5 is disposed on the bypass route R2. When the valve V5 is turned to the "open" state, the heat exchanger 182 is connected to the pumps 186, 192, while when the valve V5 is turned to the "closed" state, the heat exchanger 184 is disconnected from the pumps 186, 192.

To cool the inside of the NMR probe 10, the valves V1, V2, and V3 are set to the "open" state, while the valves V4 and V5 are set to the "closed" state. This causes the heat exchanger 182 to deliver the refrigerant gas to the bearing gas introduction pipe 172, causes the heat exchanger 184 to deliver the refrigerant gas to the driving gas introduction pipe 174, and causes the recovery pipe 176 to deliver the refrigerant gas to the pumps 186, 192. In this state, the bypass routes R1, R2 are not used. An arrow indicated by reference numeral 200 in FIG. 13 represents a circulating route of the refrigerant gas (compressed helium gas) employed when the NMR probe 10 is internally cooled.

The bearing gas is cooled through the heat exchanger 182 by the cold head 180. The driving gas is cooled through the heat exchanger 184 by the cold head 180. The bearing and driving gases are cooled to a temperature of 20K or below, for example.

The cooled bearing gas is supplied through the bearing gas introduction pipe 172 and the bearing gas feed port 22 to the bearing gas feed pipe 82. The supplied bearing gas is fed through the bearing gas feed pipe 82 to the air bearing type rotation mechanism 62 and blown onto the sample rotor 58. Meanwhile, the cooled driving gas is supplied via the driving gas introduction pipe 174 and the driving gas feed port 24 to the driving gas feed pipe 92. The supplied driving gas is fed through the driving gas feed pipe 92 to the air bearing type rotation mechanism 62 and blown onto the sample rotor 58. The bearing gas and the driving gas blown onto the sample rotor 58 cause the sample rotor 58 to rotate. Simultaneously with the rotation, the sample rotor 58 is cooled by the refrigerant gas (of the bearing gas and the driving gas). The sample rotor 58 is cooled to a temperature of, for example, 20K or below. The refrigerant gas discharged from the air bearing type rotation mechanism 62 spreads out in the sample chamber 48 and fills the same. The interior of the sample chamber 48 is cooled by the refrigerant gas.

The refrigerant gas inside the sample chamber 48 passes through the through holes, such as the through hole 38a, formed in the partition members, such as the partition member 38, and naturally flows into the detection circuit chamber 50 formed below the sample chamber 48. Then, the electronic components such as capacitors arranged in the detection circuit chamber 50 are blown by the refrigerant gas, and accordingly cooled by the refrigerant gas. The refrigerant gas inside the detection circuit chamber 50 passes through the through hole 44a formed in the partition member 44, and naturally flows into the auxiliary chamber 52 formed below the detection circuit chamber 50.

The refrigerant gas inside the auxiliary chamber 52 is naturally released from the opening 110 of the gas outlet pipe 102 into the gas outlet pipe 102. The refrigerant gas is thus discharged via the gas outlet pipe 102 and the outlet port 26 to the outside of the NM probe 10. The refrigerant gas discharged to the outside is delivered through the recovery pipe 176 to the pumps 186 and 192. The pump 186 delivers the bearing gas to the heat exchanger 182 where the bearing gas is cooled. The cooled bearing gas is fed through the bearing gas feed pipe 82 to the air bearing type rotation mechanism 62. Similarly, the pump 192 delivers the driving gas to the heat exchanger 184 where the driving gas is cooled. The cooled driving gas is fed through the driving gas feed pipe 92 to the air bearing type rotation mechanism 62.

As described above, the bearing gas and the driving gas are circulated for reuse. In other words, the refrigerant gas (composed of the bearing gas and the driving gas) blown onto the sample rotor 58 is recovered and cooled again to be blown onto the sample rotor 58. An amount of refrigerant gas consumption can be reduced by circulating and reusing the refrigerant gas. In general, helium gas is expensive. According to this embodiment, the consumption of expensive helium gas used as the refrigerant gas can be reduced, to thereby prevent an increase in costs necessary for measurement. Further, as compared with an arrangement without any circulation system, the number of times the refrigerant gas is refilled is decreased, which can facilitate management of the refrigerant gas.

The refrigerant gas blown onto the sample rotor 58 causes the sample rotor 58 to rotate, and simultaneously cools the mixture and the sample rotor 58. The static magnetic field generator 140 generates a high magnetic field of several teslas or of 10 T or greater, for example. Then, the microwave created by the microwave generator 150 is emitted onto the sample rotor 58. In transmitting operation, an RF transmission signal corresponding to the nuclide of an object to be measured is sent to the transmitting and receiving coil 60. Microwave emission excites electron spin resonance in the radicals added to the sample, and polarization of the electron spin is transferred to polarization of nuclear spin in the sample, which causes an increase in strength of the NMR signal. In receiving operation, the transmitting and receiving coil 60 detects the NMR signal having being increased in strength.

According to this embodiment, the refrigerant gas is also used as the gas for rotating the sample rotor 58. When the refrigerant gas is used in this way, the mixture and the sample rotor 58 can be rotated and at the same time cooled with the refrigerant gas.

The space in which the refrigerant gas is spread (the refrigerant gas space) is enclosed by the upper and lower airtight chambers 120 and 122. The upper and lower airtight chambers 120 and 122 are both decompressed, and therefore caused to function as the vacuum insulation spaces. This can prevent conduction of heat from outside the NMR probe 10 to the refrigerant gas space. As a result, it becomes possible to minimize the temperature rise inside the refrigerant gas space. In this embodiment, the refrigerant gas is discharged into the sample chamber 48 to thereby cool the sample chamber 48. Because the sample chamber 48 is surrounded by the vacuum insulation space, thermal insulation of the sample chamber 48 is ensured, which can help prevent a temperature rise inside the sample chamber 48. In this way, the mixture (of the sample and radicals) can be kept from increasing in temperature. For example, the mixture can be maintained at a temperature of 20K or below. According to this embodiment, the radicals can be cooled to the maximum extent possible. This can lead to an extended relaxation time of the radicals, and thus cause an increase in strength of the MNR signal. The temperature of the sample can be decreased, for example, to the temperature of liquid nitrogen or below, which can contribute to significantly enhanced sensitivity to the NMR signal. Thus, according to the present embodiment, detection sensitivity in the DNP method can be improved dramatically.

Further, the refrigerant gas inside the sample chamber passes through the through hole 38a formed in the partition member 38, and naturally flows into the circuit chamber 50A. With the thus-flown refrigerant gas, the electronic components such as capacitors housed in the circuit chamber 50A can be cooled. Because a passage of the refrigerant gas is narrowed by the through hole 38a, the refrigerant gas can be directed to impinge on the electronic components. The cooling of the electronic components can prevent thermal noise from occurring in the detection circuit, which can lead to an improved S/N ratio of the NMR signal. In some cases, the detection circuit might need air purging for the purpose of avoiding radio wave discharge. In this embodiment, because the refrigerant gas is blown onto the electronic component, the air purging is performed by the refrigerant gas.

The lower airtight chamber 122 and the gaps 86, 96, and 106 are designed to function as the vacuum insulation spaces for the bearing gas feed pipe 82, the driving gas feed pipe 92, and the gas outlet pipe 102. This can prevent thermal conduction to the interiors of the feed pipes 82, and the outlet pipe 102, to thereby minimize the increase in temperature of the refrigerant gas contained in the feed and outlet pipes 82, 92, and 102.

Figure 14:
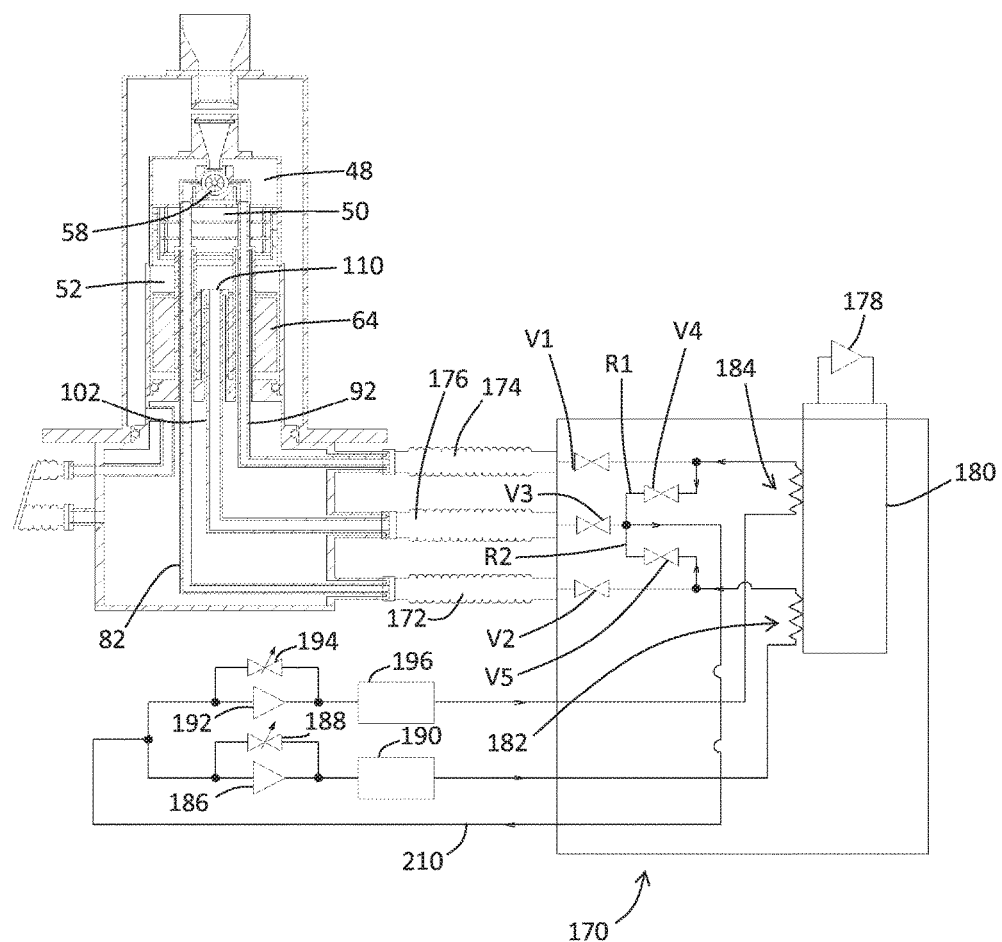
FIG. 14 is a schematic diagram showing an example of the cooling system.

Next, operation during replacement of the sample will be described with reference to FIG. 14. When the sample is replaced, the valves V1, V2, and V3 are set to the "closed" states, and the valves V4 and V5 are set to the "open" states. An arrow indicated by reference numeral 210 in FIG. 14 represents a circulating route of the refrigerant gas during replacement of the sample. Because the valves V1, V2, and V3 are closed, delivery of the refrigerant gas into both the bearing gas introduction pipe 172 and the driving gas introduction pipe 174 is blocked, and delivery of the refrigerant gas from the recovery pipe 176 to the pumps 186 and 192 is also blocked. On the other hand, because the valves V4 and V5 are open, the refrigerant gas delivered from the heat exchanger 184 is directed through the bypass route R1 to the pumps 186 and 192, and the refrigerant gas delivered from the heat exchanger 182 is also directed through the bypass route R2 to the pumps 186 and 192. Thus, at the time of replacing the sample, the refrigerant gas is not fed into the NMR probe 10, but is directed to circulate through a closed loop within the cooling apparatus 170.

Then, under the condition where the valves V1, V2, and V3 are closed while the valves V4 and V5 are opened, the outer container 28 is detached. As a result of this, the upper airtight chamber 120 is exposed to the atmosphere. Further, the inner container 30 is also detached, which exposes the interior of the inner container 30 to the atmosphere. In other words, the sample chamber 48, the detection circuit chamber 50, the auxiliary chamber 52, and the heat insulation area 54 are vented to the atmosphere. In this embodiment, because the interior of the inner container 30 is separated from the lower airtight chamber 122 by the sealing bulkhead 36, the lower airtight chamber 122 can be maintained in the vacuum state even when the interior of the inner container 30 is vented to the atmosphere. The gaps 86, 96, and 106 communicating with the lower airtight chamber 122 are also maintained in the vacuum state. The vacuum state remains locally while the sample is being replaced. That is, a stable condition is maintained in a part of the NMR probe 10. In this way, the time required to prepare for the next measurement can be shortened, as distinct from a case where all areas inside the NMR probe 10 are exposed to the atmosphere. That is, because some of the areas are maintained in the vacuum state, the time required to achieve the intended vacuum state can become shorter than the time required to decompress both the upper and lower airtight chambers 120, 122 from the atmospheric pressure.

As described above, the refrigerant gas is circulated through the closed loop within the cooling apparatus 170 during sample replacement operation. This can ensure that the refrigerant gas is maintained at low temperature within the cooling apparatus 170 even after the interior of the NMR probe 10 is vented to the atmosphere. After replacing the sample and subsequently reattaching the outer and inner containers 28 and 30, the valves V1, V2, and V3 are turned to the "open" state, while the valves V4 and V5 are turned to the "closed" state. This causes the refrigerant gas maintained at lower temperatures in the cooling apparatus 170 to be introduced into the NMR probe 10. For this reason, the NMR probe 10 is internally cooled within a shorter time period, and the next measurement can be started immediately.

It should be noted that the gas outlet pipe 102 is thermally connected to a preliminary amplifier. The preliminary amplifier is an amplifier for amplifying the NMR signal. The preliminary amplifier is thermally contacted with the gas outlet pipe 102 and accordingly cooled to a low temperature.

In this way, occurrence of the thermal noise can be avoided, and the S/N ratio can be accordingly improved.

What is claimed is:

1. An NMR probe for detecting a nuclear magnetic resonance signal from a sample, comprising:
   a sample container that retains the sample;
   a rotation mechanism that blows a refrigerant gas to rotate the sample container and also cool the sample container;
   an inner structure that defines a refrigerant gas space filled with the refrigerant gas which is discharged from the rotation mechanism; and
   an outer structure that defines a vacuum insulation space surrounding the refrigerant gas space, wherein:
   the refrigerant gas space comprises,
   a first partial space filled with the refrigerant gas which is discharged from the rotation mechanism, and
   a second partial space that communicates with the first partial space, and houses an electric circuit for detecting the nuclear magnetic resonance signal;
   the inner structure includes a blower section for blowing the refrigerant gas from the first partial space toward the electric circuit housed in the second partial space; and
   a first partition member that separates the first partial space from the second partial space, wherein
   the blower section is a refrigerant gas passage defined in the first partition member.

2. The NMR probe according to claim 1, wherein:
   the sample includes a substance having an unpaired electron, and
   the nuclear magnetic resonance signal is detected from the sample while radiating the sample with a microwave.

3. An NMR probe for detecting a nuclear magnetic resonance signal from a sample, comprising:
   a sample container that retains the sample;
   a rotation mechanism that blows a refrigerant gas to rotate the sample container and also cool the sample container;
   an inner structure that defines a refrigerant gas space filled with the refrigerant gas which is discharged from the rotation mechanism; and
   an outer structure that defines a vacuum insulation space surrounding the refrigerant gas space, wherein:
   the refrigerant gas space comprises,
   a first partial space filled with the refrigerant gas which is discharged from the rotation mechanism, and
   a second partial space that communicates with the first partial space, and houses an electric circuit for detecting the nuclear magnetic resonance signal;
   the inner structure includes a blower section for blowing the refrigerant gas from the first partial space toward the electric circuit housed in the second partial space;
   a feed pipe for feeding the refrigerant gas from outside the NMR probe to the rotation mechanism, and
   an outlet pipe for discharging the refrigerant gas from the refrigerant gas space to outside the NMR probe, wherein:
   the vacuum insulation space includes,
   a first vacuum insulation space defined between the feed pipe and the refrigerant gas space, and
   a second vacuum insulation space defined between the outlet pipe and the refrigerant gas space.

4. The NMR probe according to claim 3, wherein:
   a closed loop is formed by installing a cooling apparatus that cools the refrigerant gas discharged from the outlet pipe and returns the cooled refrigerant gas back to the feed pipe, and
   the refrigerant gas is circulated through the closed loop.

5. The NMR probe according to claim 4, further comprising a bypass section that blocks a route connecting the cooling apparatus to both the feed pipe and the outlet pipe, and accordingly directs the refrigerant gas to circulate within the cooling apparatus.

6. The NMR probe according to claim 4, wherein:
   the inner structure comprises:
   an inner container that surrounds the refrigerant gas space and has an opening on a base end side of the inner container;
   a sealing member that seals the opening;
   a first sheath member arranged to sheathe the feed pipe with the first vacuum insulation space defined in the first sheath member; and
   a second sheath member arranged to sheathe the outlet pipe with the second vacuum insulation space defined in the second sheath member.

7. The NMR probe according to claim 6, wherein:
   the feed pipe is extended from outside the NMR probe to the rotation mechanism;
   the outlet pipe is extended from outside the NMR probe to the second partition member disposed above the sealing member within the inner container; and
   an opening formed at an end of the outlet pipe is opened toward a partial space formed above the second partition member.

8. The NMR probe according to claim 7, further comprising a gas convection regulating member filled in a partial space between the second partition member and the sealing member.

9. The NMR probe according to claim 6, wherein:
   the outer structure comprises:
   an outer container that surrounds the inner container;
   a bottom unit arranged below the outer container;
   the vacuum insulation space comprises;
   a first chamber formed between the outer container and the inner container;
   a second chamber formed below the sealing member within the bottom unit; and
   the second chamber communicates with both the first vacuum insulation space and the second vacuum insulation space.

* * * * *